(12) United States Patent
Seko

(10) Patent No.: US 7,466,030 B2
(45) Date of Patent: Dec. 16, 2008

(54) SEMICONDUCTOR DEVICE AND FABRICATION PROCESS THEREOF

(75) Inventor: Toshiharu Seko, Yamabe-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/668,234

(22) Filed: Sep. 24, 2003

(65) Prior Publication Data
US 2004/0061240 A1 Apr. 1, 2004

(30) Foreign Application Priority Data
Sep. 30, 2002 (JP) ............... 2002-287258

(51) Int. Cl.
*H01L 23/48* (2006.01)
(52) U.S. Cl. ............ 257/778; 257/684; 257/782; 257/701
(58) Field of Classification Search ........... 257/778, 257/786, 782, 783, 684, 701
See application file for complete search history.

(56) References Cited

U.S. PATENT DOCUMENTS

| | | | |
|---|---|---|---|
| 5,656,862 A * | 8/1997 | Papathomas et al. ........ 257/778 |
| 5,710,071 A * | 1/1998 | Beddingfield et al. ........ 438/108 |
| 5,953,814 A * | 9/1999 | Sozansky et al. ............ 29/840 |
| 6,083,774 A | 7/2000 | Shiobara et al. |
| 6,542,374 B1 | 4/2003 | Muramatsu et al. |
| 2002/0043713 A1 * | 4/2002 | Seko ...................... 257/692 |
| 2002/0142167 A1 | 10/2002 | Yamaguchi et al. |

FOREIGN PATENT DOCUMENTS

| | | |
|---|---|---|
| JP | 7180/1990 | 2/1990 |
| JP | 77227/1995 | 8/1995 |
| JP | 09-064103 | 3/1997 |
| JP | 2002-124544 | 4/2002 |
| JP | 2002-244580 | 8/2002 |
| JP | 2002-270652 | 9/2002 |
| JP | 2004-075835 | 3/2004 |

OTHER PUBLICATIONS

Korean Office Action mailed Sep. 21, 2005 (w/English translation thereof).
KR 2002-0063513 dated Aug. 3, 2002 (U.S. counterpart US 2002/0142167 listed above).

* cited by examiner

*Primary Examiner*—Leonardo Andújar
(74) *Attorney, Agent, or Firm*—Nixon & Vanderhye P.C.

(57) ABSTRACT

The semiconductor device uses an insulating resin that contains at least a resin anti-repellent for adjusting wettability of the insulating resin. The insulating resin is applied on a circuit board, and a semiconductor element is placed thereon and pressed against it. The applied pressure pushes out a portion of the insulating resin under the semiconductor element. This portion of the insulating resin combines with a portion of the insulating resin around the semiconductor element to form a resin fillet on the side surfaces of the semiconductor element.

8 Claims, 4 Drawing Sheets

SEMICONDUCTOR DEVICE AND FABRICATION PROCESS THEREOF

FIELD OF THE INVENTION

The present invention relates to semiconductor devices and fabrication processes thereof, and particularly to COF (Chip on Film) semiconductor devices ("COF" hereinafter) in which a semiconductor element is bonded to a flexile circuit board, and to fabrication processes of such semiconductor devices.

BACKGROUND OF THE INVENTION

There has been rapid advancement in the field of electronic devices such as portable phones and portable information terminals in realizing smaller, thinner, and more lightweight devices. This progress has called for improvements in various components of these electronic devices, including a semiconductor device mounted in an electronic device, in terms of size, weight, function, performance, and packing density.

Currently, in some semiconductor devices, one approach to realize higher packing density and to reduce thickness and weight of the device is to mount a semiconductor element on a circuit board that is realized by forming an interconnection pattern on a thin insulating tape.

Examples of such semiconductor devices include TCP (Tape Carrier Package) and COF. In COF, no opening is formed to mount a semiconductor element, but the semiconductor element is mounted by being bonded to a thin insulating tape. The thin insulating tape used in COF is bendable to accommodate different applications. An interconnection pattern is formed on a surface of the insulating tape to realize a flexible circuit board. The interconnection pattern is electrically connected to the projecting electrodes formed on the semiconductor element. The external connectors of the interconnection pattern are connected to external devices such as a liquid crystal panel and a printed board.

For insulation, a solder resist is applied in the fabrication process to exposed portions of the interconnection pattern, other than the portion connected to the semiconductor element and the portion where the external connectors are provided.

One fabrication process of COF currently available is the MBB (Micro Bump Bonding). Another process, which has come into use in the last years, is a resin encapsulation process using an NCP (Non-Conductive Paste) or an ACP (Anisotropic Conductive Paste). These techniques are effective for semiconductor devices requiring multiple pins, narrow pitch, and edge touch. In the resin encapsulation process, an insulating resin is interposed between the semiconductor element and the flexible circuit board, and the projecting electrodes of the semiconductor element and the interconnection pattern on the flexible circuit board are connected to each other and sealed with the resin.

Examples of COF fabrication processes using a conventional MBB technique are disclosed in Tokukouhei (Published Japanese Translation of PCT international Publication for Patent Application) 2-7180 (published on Feb. 15, 1990; "Publication 1" hereinafter), and Tokukouhei 7-77227 (published on Aug. 16, 1995; "Publication 2" hereinafter).

In the technique disclosed in Publication 1, as shown in FIG. 3(a), a solder resist 5 is first applied to cover an interconnection pattern 2 on a circuit board 20 that has been prepared by forming the interconnection pattern 2 on an insulating tape 1. Here, the solder resist 5 is not applied to portions of the interconnection pattern 2 (these portions will be referred to as "contacts 4") to be bonded with the semiconductor element, or to portions of the interconnection pattern 2 where the connectors are provided.

Then, as shown in FIG. 3(b), an insulating resin 14 is applied on the contacts 4. In the next step, as shown in FIG. 3(c), projecting electrodes (bumps) 6 of the semiconductor element 3 are aligned with the contacts 4 of the interconnection pattern 2, and the semiconductor element 3 is pressed down in the direction of arrow A. The pressure exerted on the semiconductor element 3 pushes out the insulating resin 14 under the semiconductor element 3 in the direction of arrow B, so that the insulating resin 14 is in contact with the projecting electrodes 6 of the semiconductor element 3 and the contacts 4 of the interconnection pattern 2, while allowing electrical connections between the two. Further, by being pushed out, the insulating resin 14 protrudes from the semiconductor element 3 around the edges of the semiconductor element 3.

Then, as shown in FIG. 3(d), the insulating resin 14 is cured to anchor the semiconductor element 3 on the circuit board 20. The insulating resin 14 is usually a light curable resin or a thermosetting resin. Accordingly, the insulating resin 14 is cured by irradiation of light or application of heat, as indicated by arrow D.

The technique disclosed in Publication 2 is illustrated in FIG. 4(a) through FIG. 4(d). The fabrication process of Publication 2 is the same as that of Publication 1 up to the step where the projecting electrodes 6 of the semiconductor element 3 are aligned with the contacts 4 of the interconnection pattern 2 and pressure is applied on the semiconductor element 3. In the next step, however, the process of Publication 2 energizes a pulse heating tool to heat the semiconductor element 3, as indicated by arrow C in FIG. 4(d), with the pressure being exerted on the semiconductor element 3. The applied heat cures the insulating resin 14 and anchors the semiconductor element 3 on the circuit board 20, with the projecting electrodes 6 of the semiconductor element 3 being electrically connected to the contacts 4 of the interconnection pattern 2.

One drawback of the foregoing conventional techniques is the poor strength and poor reliability of resin sealing. Further, the foregoing publications are associated with fabrication problems caused by the insulating resin, when the insulating resin rises to the pressure applying tool or heat applying tool used to apply pressure or heat to the semiconductor element. Therefore, the foregoing prior art techniques do not qualify as a technique for resin sealing.

Specifically, Publications 1 and 2 both employ a technique in which the projecting electrodes 6 of the semiconductor element 3 are aligned with the contacts 4 of the interconnection pattern 2, and pressure is exerted on the semiconductor element 3 to push the insulating resin 14 sideways to the edges of the semiconductor element 3, as shown in FIG. 3(c) and FIG. 4(c).

Thus, a phenomenon known as "resin repelling," as indicated by arrow E, is caused when the amount of insulating resin 14 applied is small. Namely, due to poor wettability of the insulating resin 14, the pressure exerted on the semiconductor element 3 cannot spread the insulating resin 14, with the result that the insulating resin 14 remains in the vicinity of the semiconductor element 3. This may lead to a problem that a portion of the interconnection pattern 2 around the semiconductor element 3 is exposed in an area surrounded by the solder resist 5. Another deficiency is that the resin fillet, which is formed along the side surfaces of the semiconductor element to anchor the semiconductor element 3, cannot have enough size, with the result that the strength and reliability of resin sealing become poor.

The problem of exposed pattern in the interconnection pattern 2 can be solved by allowing the insulating resin 14 to more easily migrate to the solder resist 5. This can be carried out by increasing the amount of insulating resin 14 applied. However, by "resin repelling" as indicated by arrow E, the insulating resin 14 rises along the side surfaces of the semiconductor element 3 in the direction of arrow F when the projecting electrodes 6 of the semiconductor element 3 are pressed against the contacts 4 of the interconnection pattern 2. This is problematic because the insulating resin 14 adheres to the pressure applying tool and/or heat applying tool used to apply pressure and/or heat to the semiconductor element 3.

The problem of "resin rise" as indicated by arrow F is even more problematic these days in light of the development of thinner semiconductor devices with a proportionally reduced thickness of the semiconductor elements.

SUMMARY OF THE INVENTION

The present invention was made in view of the foregoing problems, and it is an object of the present invention to provide a semiconductor device that excels in performance and quality, by improving strength and reliability of resin sealing and by preventing fabrication problems caused by "rise" of the insulating resin, and to provide a fabrication process of such a semiconductor device.

In order to achieve the foregoing object, a semiconductor device of the present invention includes: an insulating substrate having an interconnection pattern; a semiconductor element, having a projecting electrode, electrically connected to the interconnection pattern via the projecting electrode; and a resin fillet for anchoring the semiconductor element, the resin fillet being an insulating resin containing at least a resin anti-repellent for adjusting wettability of the insulating resin.

With this configuration, because the insulating resin contains a resin anti-repellent, a portion of the interconnection pattern around the semiconductor element can be prevented from being exposed in an area surrounded by the solder resist, when making electrical connections between the semiconductor element and the interconnection pattern. In addition, the resin fillet, which is formed under and around the semiconductor element, can increase in size. That is, the semiconductor element can be more firmly anchored on the insulating substrate.

As a result, the strength and reliability of resin sealing can be improved. Further, in the fabrication process, it is possible to prevent the problem of resin adhesion, which is caused when the insulating resin rises along the side surfaces of the semiconductor element and adheres to the pressure applying tool and/or heat applying tool used to apply pressure and/or heat to the semiconductor element, in connecting the semiconductor element with the interconnection pattern by applying pressure on the semiconductor element. These and other fabrication problems can thus be prevented.

In order to achieve the foregoing object, a fabrication process of a semiconductor device according to the present invention includes: a solder resist coating step of coating a solder resist on the interconnection pattern formed on the insulating substrate, except for at least a portion of the interconnection pattern where a semiconductor element is to be mounted; an insulating resin applying step of applying an insulating resin on the interconnection pattern after the solder resist coating step, including the portion of the interconnection pattern where the semiconductor element is to be mounted; and a semiconductor element pressing step of placing the semiconductor element on the insulating resin applied, and pressing the semiconductor element against the interconnection pattern on the insulating substrate, so as to make an electrical connection between a projecting electrode of the semiconductor element and the interconnection pattern, wherein the insulating resin used in the insulating resin applying step contains at least a resin anti-repellent for adjusting wettability of the insulating resin, and the insulating resin is applied in such a manner that a resin fillet is formed on side surfaces of the semiconductor element by a portion of the insulating resin pushed out from under the semiconductor element in the semiconductor element pressing step and by a portion of the insulating resin around the semiconductor element.

With this fabrication process, because the insulating resin applied in the insulating resin applying step contains a resin anti-repellent, a portion of the interconnection pattern around the semiconductor element can be prevented from being exposed in an area surrounded by the solder resist, when making electrical connections between the semiconductor element and the interconnection pattern in the semiconductor element pressing step. In addition, the resin fillet, which is formed under and around the semiconductor element, can increase in size. That is, the semiconductor element can be more firmly anchored on the insulating substrate.

As a result, the strength and reliability of resin sealing can be improved. Further, in the fabrication process, it is possible to prevent the problem of resin adhesion, which is caused when the insulating resin rises along the side surfaces of the semiconductor element and adheres to the pressure applying tool and/or heat applying tool used to apply pressure and/or heat to the semiconductor element, in connecting the semiconductor element with the interconnection pattern by applying pressure on the semiconductor element. These and other fabrication problems can thus be prevented.

For a fuller understanding of the nature and advantages of the invention, reference should be made to the ensuing detailed description taken in conjunction with the accompanying drawings.

DESCRIPTION OF THE EMBODIMENTS

First Embodiment

Figure 1:
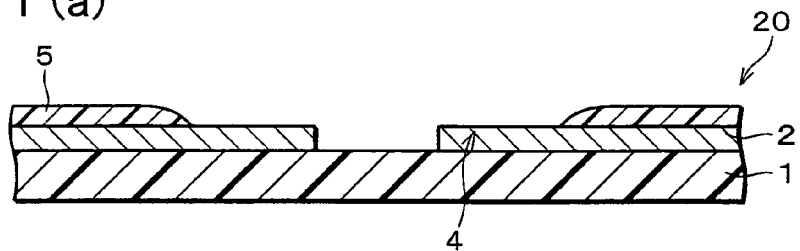
FIG. 1(a) through FIG. 1(e) are cross sectional views schematically showing one example of a semiconductor device according to the present invention.
Figure 1:
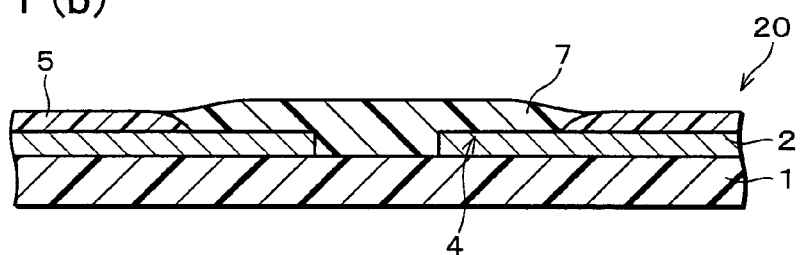
Figure 1:
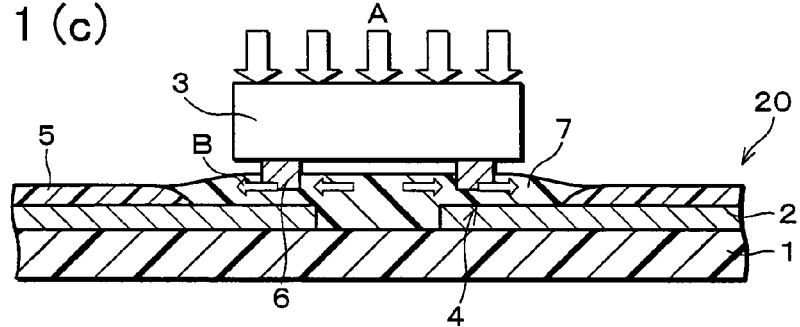
Figure 1:
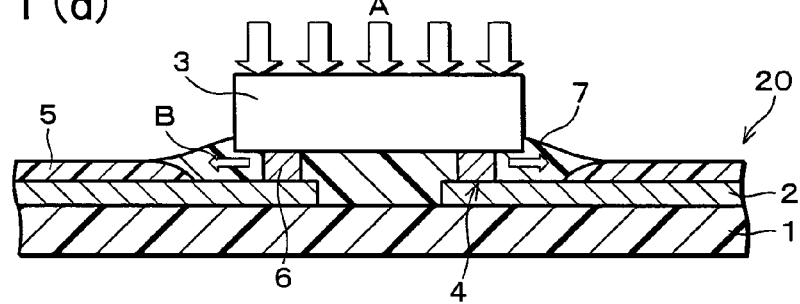
Figure 1:
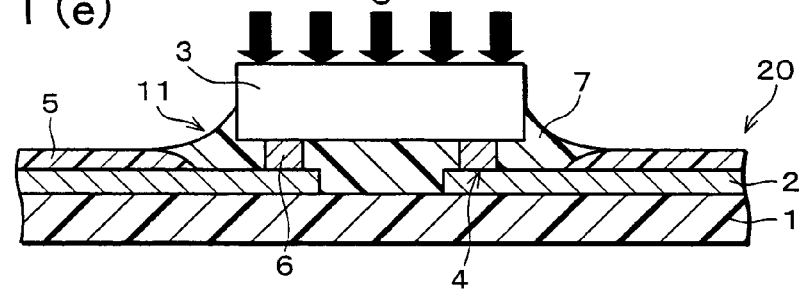

One embodiment of the present invention is described below with reference to FIG. 1(a) through FIG. 1(e). It should be noted that the present invention is not limited by the following descriptions.

A semiconductor device of the present invention includes an interconnection pattern formed on an insulating substrate. A semiconductor element is electrically connected to the interconnection pattern via projecting electrodes. A resin layer and a resin fillet are formed around the semiconductor element and between the semiconductor element and the insulating substrate. In the semiconductor device of the present invention according to this configuration, the resin fillet is formed using an insulating resin containing a resin anti-repellent for adjusting wettability of the insulating resin.

More specifically, as shown in FIG. 1(e), the semiconductor device of the present embodiment includes a circuit board 20, a semiconductor element 3, and a resin fillet 11, among other components.

The circuit board 20 includes an insulating tape 1, an interconnection pattern 2, and a solder resist 5. The insulating tape 1 is provided as an insulating substrate, and the interconnection pattern 2 is provided on a surface of the insulating tape 1. The insulating tape 1 is preferably bendable. However, the insulating tape 1 is not particularly limited so long as it is an insulator and has a surface that allows the interconnection pattern 2 to be formed. Specifically, polyimide-based insulating tapes, containing polyimide or captone for example, are preferable. The thickness of the polyimide-based insulating tape is not limited to a particular thickness, but is preferably thin in order to provide enough flexibility. Specifically, a thickness in a range of 15 µm to 40 µm is preferable. More specifically, a thickness of, for example, 15 µm, 20 µm, 25 µm, 38 µm, or 40 µm is preferable.

The interconnection pattern 2 is not particularly limited so long as it is conductive and suitably patterned according to the configuration or use of the semiconductor device. For example, an interconnection pattern of a metal thin film is available. The interconnection pattern 2 is not particularly limited to a particular metal, but copper is preferable. Further, the interconnection pattern 2 is preferably a thin film, for which a copper foil is preferably used. The thickness of the interconnection pattern 2 is preferably in a range of 5 µm to 18 µm. More specifically, a thickness of, for example, 5 µm, 8 µm, 9 µm, 12 µm, or 18 µm is preferable.

When the interconnection pattern 2 is a copper foil, the surface of the interconnection pattern 2 is preferably plated to prevent corrosion. The kind of plated metal is not particularly limited, but tin or gold is preferable. Note that, for simplicity, FIG. 1(a) through FIG. 1(e) do not illustrate plating.

The method of forming the interconnection pattern 2 on the insulating tape 1 and the method of plating the surface of the interconnection pattern 2 are not particularly limited. Any conventionally known methods can be suitably used therefor.

With the circuit board 20, which is thin and bendable, a COF semiconductor device can be fabricated.

The COF or TCP semiconductor device has a structure in which a semiconductor element is mounted on the flexible circuit board by being bonded thereon. The COF or TCP semiconductor device is commonly used for liquid crystal display devices in particular. Specifically, when the semiconductor element is a liquid crystal driver IC, the COF or TCP semiconductor device can serve as a liquid crystal driver for driving a liquid crystal panel. The liquid crystal driver may be combined with the liquid crystal panel to realize a liquid crystal module, which may be incorporated as a display section in various types of electronic devices.

In TCP, a portion of the insulating tape where the semiconductor element is to be mounted has an opening known as a device hole. Through the device hole, the inner leads, which are an interconnection pattern, are cantilevered, so as to make electrical connections between the tips of the inner leads and the semiconductor element.

In COF, on the other hand, the insulating tape does not have an opening for mounting the semiconductor chip. Instead, the interconnection pattern to be connected to the electrodes of the semiconductor element is formed on a surface of the insulating tape.

COF enables more high-density packing than TCP, the TCP being one method of semiconductor packaging. Therefore, COF is more advantageous than TCP in packaging chips in a complicated area.

As described, the COF semiconductor device using the conventional MBB technique has the problem of poor strength and poor reliability of resin sealing. Further, serious problems may be caused in the fabrication process. The present invention successfully prevents these problems to provide a high-performance and high-quality semiconductor device, as will be described later.

Note that, the present invention is not just limited to the described embodiment in which the circuit board 20 is prepared using the insulating tape 1. Alternatively, the circuit board 20 may be prepared by forming the interconnection pattern 2 on various types of conventional insulating substrates.

That is, the present invention is applicable not only to the COF semiconductor device but also to a wide variety of semiconductor devices in which a semiconductor element is formed on the insulating substrate having an interconnection pattern.

The semiconductor element 3 is not particularly limited so long as it includes various types of integrated circuits according to the use of the semiconductor device. For example, conventionally available semiconductor chips or ICs may be used.

The semiconductor element 3 has projecting electrodes 6. The projecting electrodes 6 are used to make electrical connections between the semiconductor element 3 and the interconnection pattern 2. The projecting electrodes 6 are not particularly limited, but bumps are suitably used for example. The material of the projecting electrodes 6 is not limited to a particular type of material so long as it is conductive and provides good contacts with the interconnection pattern 2. For example, gold is preferably used for the projecting electrodes 6. Note that, the term "contacts 4" will be used to refer to portions of the interconnection pattern 2 where the electrical connections with the projecting electrodes 6 are made.

The circuit board 20 is coated with the solder resist 5, except for portions where the contacts 4 are provided and for portions where connectors (not shown) providing external connections are provided. In other words, the contacts 4 and portions of the circuit board 20 in the vicinity of the connectors are not covered with the solder resist 5 but are exposed to make contacts with the projecting electrodes 6 of the semiconductor element 3 and with external devices during fabrication.

The solder resist 5 is a heat resistance coating applied to specific regions on the printed circuit board to insulate the interconnection pattern 2. The solder resist 5 is not particularly limited, and any conventionally available solder resist may be suitably used.

The resin fillet 11 is a resin with an insulating property. The resin fillet 11 anchors the semiconductor element 3, with the projecting electrodes 6 being electrically connected to the contacts 4 of the interconnection pattern 2. In the present embodiment, the resin fillet 11 is made of an insulating resin 7 containing a resin anti-repellant.

The type of insulating resin 7 containing a resin anti-repellant is not particularly limited so long as it can insulate the semiconductor element 3, other than the regions where the projecting electrodes 6 are provided, from the interconnection pattern 2. In the present invention, a light curable resin or a thermosetting resin is preferably used for the insulating resin 7. With the use of these resins, the insulating resin 7 can be readily cured by irradiation of light or by applied heat.

Examples of the light curable resin and thermosetting resin include but are not particularly limited to epoxy resins and acryl resins.

The resin anti-repellant adjusts wettability of the insulating resin. Note that, the resin anti-repellant will be described later in connection with the fabrication process of the semiconductor device to be described later.

The semiconductor device of the present embodiment is connected to various devices such as a liquid crystal panel or a printed board via the connectors (not shown) of the interconnection pattern 2 providing external connections. The layout of the connectors is not particularly limited, and is suitably selected according to the type of device component to be connected.

The fabrication process of the semiconductor device of the present embodiment includes a solder resist coating step, an insulating resin applying step, and a semiconductor element pressing step.

The solder resist coating step is a step in which the solder resist 5 is coated on the interconnection pattern 2 formed on the surface of the insulating tape 1, without covering at least the portions of the interconnection pattern 2 where the semiconductor element 3 is to be mounted, i.e., the contacts 4 of the interconnection pattern 2, as shown in FIG. 1(a).

The extent to which the contacts 4 are exposed is not particularly limited so long as the exposed portions of the interconnection pattern 2 ensure bonding with the projecting electrodes 6 of the semiconductor element 3. Further, the method or condition of forming the solder resist 5 is not particularly limited. A conventionally known coating method can be suitably used therefor.

The insulating resin applying step is followed by the solder resist coating step, as shown in FIG. 1(b). In the insulating resin applying step, the insulating resin 7 is applied on the interconnection pattern 2, including the contacts 4. The method of applying the insulating resin 7 is not particularly limited and a conventionally known application method can be suitably used, so long as the resin fillet 11 is formed on the side surfaces of the semiconductor element 3 in the semiconductor element pressing step by a portion of the insulating resin 7 that is pushed out from under the semiconductor element 3 and a portion of the insulating resin 7 around the edges of the semiconductor element 3.

It should be noted here that the region of the interconnection pattern 2, including the contacts 4, where the insulating resin 7 is applied is not limited to a particular region. For example, the insulating resin 7 may be applied in such a region that the insulating resin 7 is in contact with or partially covers the solder resist 5. Alternatively, the insulating resin 7 may be applied in the vicinity of the solder resist 5, so as to cover the solder resist 5 by bleeding.

By thus applying the insulating resin 7 so that the insulating resin 7 is in contact with or partially covers the solder resist 5, it is ensured that a portion of the interconnection pattern 2 around the semiconductor element 3 is prevented from being exposed in an area surrounded by the solder resist 5, i.e., an area where the solder resist 5 is not formed. Further, it is ensured that the resin fillet 11 is formed in the semiconductor element pressing step, to be described later.

In the semiconductor element pressing step, as shown in FIG. 1(c), the semiconductor element 3 is placed above the insulating resin 7, and is pressed down onto the surface of the interconnection pattern 2 (in the direction of arrow A), so as to make electrical connections between the projecting electrodes 6 of the semiconductor element 3 and the contacts 4 of the interconnection pattern 2.

The means (pressure applying means) to apply pressure on the semiconductor element 3 is not particularly limited, and a conventionally known pressure applying tool can be suitably used. A pulse heating tool is particularly preferable. The conditions for applying pressure are not particularly limited, so long as the applied pressure does not break the semiconductor element 3 but is strong enough to push out the insulating resin 7 and to sufficiently make electrical connections between the projecting electrodes 6 and the contacts 4. As understood from FIG. 1, the pushing out of the insulating resin 7 to accomplish the electrical connection means that insulating resin 7 effectively seals the projecting electrode 6 in electrical contact with the interconnection pattern.

In the present embodiment, the insulating resin 7 used in the insulating resin applying step contains at least a resin anti-repellent to provide improved wettability, thereby preventing potential problems associated with wettability of the insulating resin 7. The following describes how wettability of the insulating resin 7 is adjusted.

A solid surface is usually in contact with air and absorbs gas to form a solid-gas interface. In order bring liquid into direct contact with solid, the liquid must break through the solid-gas interface and form a solid-liquid interface. The ability of the liquid to form a solid-liquid interface from a solid-gas interface is called "wettability."

The resin fillet 11 is formed by the following sequence of steps: applying the insulating resin 7 on the circuit board 20, applying pressure on the semiconductor element 3, and curing the insulating resin 7, as described above.

Figure 3:
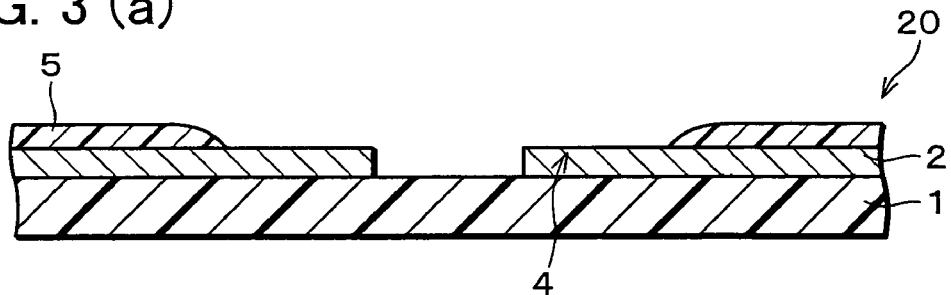
FIG. 3(a) through FIG. 3(d) are cross sectional views schematically showing a semiconductor device of one conventional example.
Figure 3:
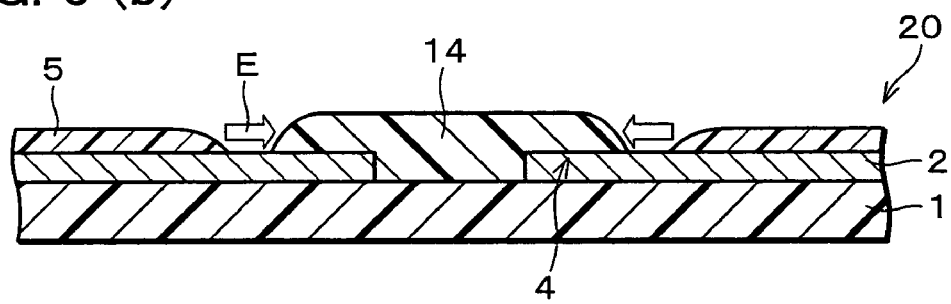
Figure 3:
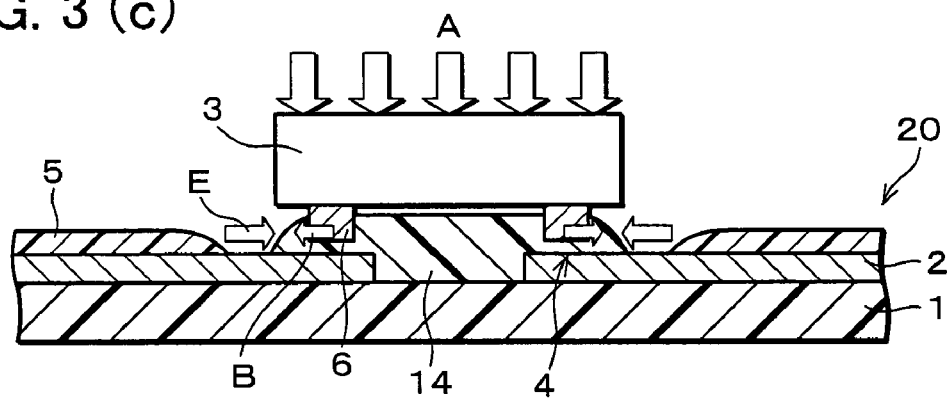
Figure 3:
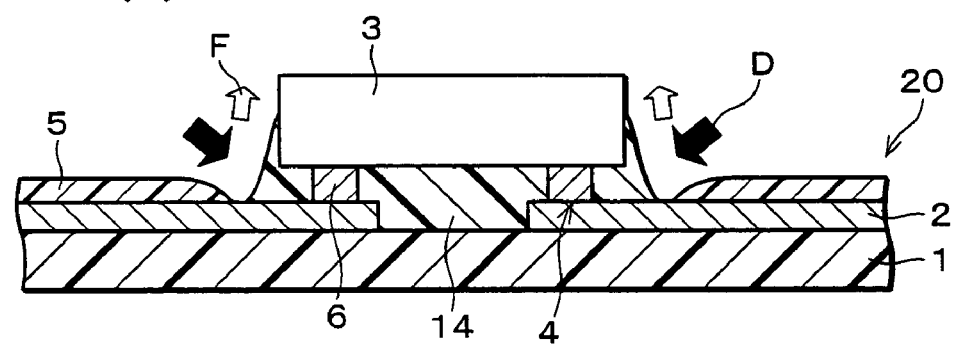
Figure 4:
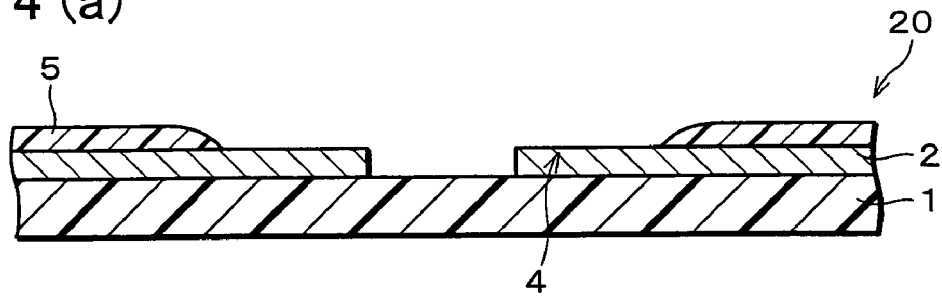
FIG. 4(a) through FIG. 4(d) are cross sectional views schematically showing a semiconductor device of another conventional example.
Figure 4:
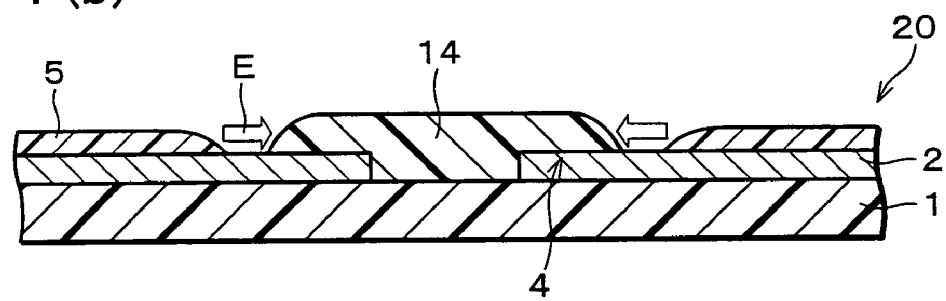
Figure 4:
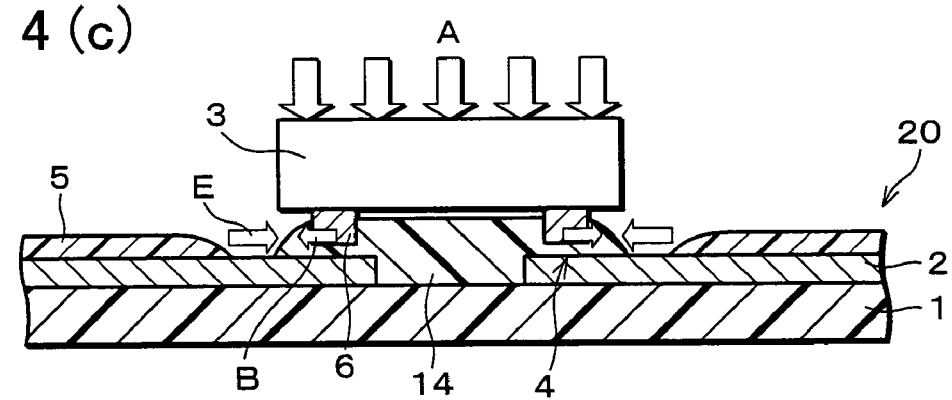
Figure 4:
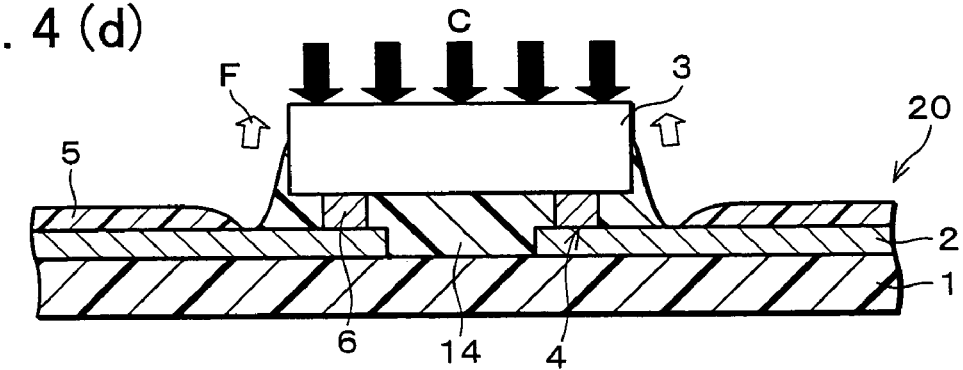

However, in the insulating resin 14 of the conventional example (see FIG. 3(c) or FIG. 4(c)), due to poor wettability, the "resin repelling" phenomenon is caused in which the insulating resin 14 does not spread over the surface of the interconnection pattern 2 or to the vicinity of the solder resist 5. Thus, when the amount of insulating resin 14 applied is small, the interconnection pattern 2 is easily exposed in regions where the solder resist 5 is not formed. In addition, the resin fillet 11 cannot have a sufficient size. On the other hand, when the insulating resin 14 is applied in a large amount, "resin repelling" causes the insulating resin 14 to rise along the side surfaces of the semiconductor element 3 in an excessive amount, causing the problem of resin adhesion, in which the insulating resin 14 adheres to the pressure applying tool or heat applying tool.

In the present embodiment, however, the insulating resin 7 contains a resin anti-repellent to improve wettability and suppress resin repelling. It should be noted here that the wettability of the insulating resin 7 is the ability of the insulating resin 7 to wet the circuit board 2, the insulating substrate 1, and the solder resist 5.

In the semiconductor element pressing step, as shown in FIG. 1(d), the insulating resin 7 is pushed out by the applied pressure (in the direction of arrow A) on the semiconductor element 3 and spreads (in the direction of arrow B) to the edges of the semiconductor element 3, thereby preventing the interconnection pattern 2 from being exposed in regions where the solder resist is not formed. Further, by controlling resin repelling, the "rise" of the insulating resin 7 can be limited. As a result, the insulating resin 7 can desirably form the resin fillet 11 by having enough affinity to the side surfaces of the semiconductor element 3 but weak enough to prevent contact with the pressure applying tool or heat applying tool.

The resin anti-repellent used in this embodiment is not particularly limited so long as it can adjust the wettability of the insulating resin. Specifically, a surfactant is preferably used. By using a surfactant for the resin anti-repellent, the problem of resin repelling can be prevented in the insulating resin. This improves the strength and reliability of resin sealing, and effectively solves the problems caused in the fabrication process.

The surfactant is suitably selected according to the type of insulating resin. Accordingly, the type or amount of surfactant used is not particularly limited.

In the fabrication process of the semiconductor device of the present embodiment, the semiconductor element pressing step is followed by a resin curing step, in which the insulating resin 7 forming the resin fillet 11 is cured. The conditions of resin curing in the resin curing step are not particularly limited, and are suitably selected according to the type of the insulating resin 7. In the present embodiment, the insulating resin 7 is preferably a light curable resin or a thermosetting resin. Therefore, in the resin curing step, the insulating resin 7 forming the resin fillet 11 is cured by irradiation of light on the resin fillet 11, or by irradiation of light, through the circuit board 20, on the insulating resin 7 between the semiconductor element 3 and the circuit board 20. In the case of a thermosetting resin, heat is applied to cure the insulating resin 7.

For example, when the thermosetting resin is an epoxy resin, a pulse heating tool is used to apply heat (in the direction of arrow C) in a temperature range of 230° C. to 250° C. while applying pressure on the semiconductor element 3, as shown in FIG. 1(e). The applied heat cures the resin and anchors the semiconductor element 3 on the surface of the circuit board 20, with the semiconductor element 3 being electrically connected to the circuit board 20.

As described, the present invention uses a resin containing a resin anti-repellent to form a resin fillet. Thus, when making electrical connections with the semiconductor element, a portion of the interconnection pattern around the semiconductor element is prevented from being exposed in an area surrounded by the solder resist. In addition, the resin fillet formed under and around the semiconductor element can increase in size.

Further, in applying pressure on the semiconductor element to make electrical connections with the interconnection pattern, it is possible to prevent the problems of "resin rise" and "resin adhesion," which are caused during the fabrication process when the insulating resin rises along the side surfaces of the semiconductor element 3 and adheres to the pressure applying tool or heat applying tool used to apply pressure or heat to the semiconductor element. These and other fabrication problems can thus be prevented by the present invention.

The present invention is therefore suitably used in the fabrication of COF semiconductor devices, as well as the fabrication of various devices using the COF semiconductor device, including portable phones, portable information terminals, and liquid crystal display panels, for example.

Second Embodiment

The following describes another embodiment of the present invention with reference to FIG. 2(a) through FIG. 2(e). It should be appreciated that the present invention is not limited by the following descriptions. For simplicity, elements having the same functions as those already described in the First Embodiment are given the same reference numerals and explanations thereof are omitted here.

Figure 2:
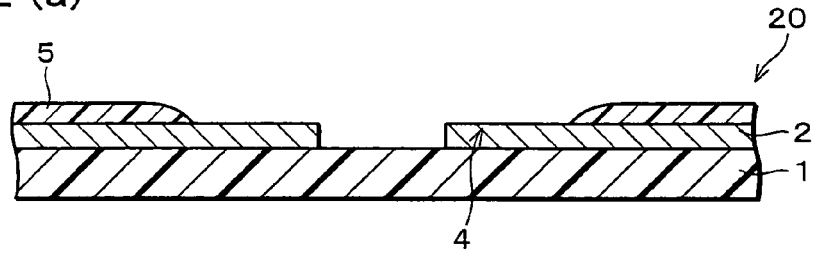
FIG. 2(a) through FIG. 2(e) are cross sectional views schematically showing another example of the semiconductor device according to the present invention.
Figure 2:
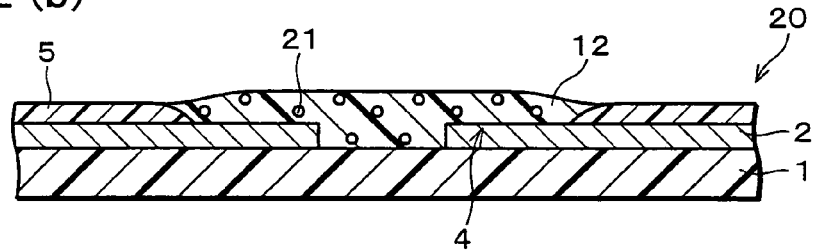
Figure 2:
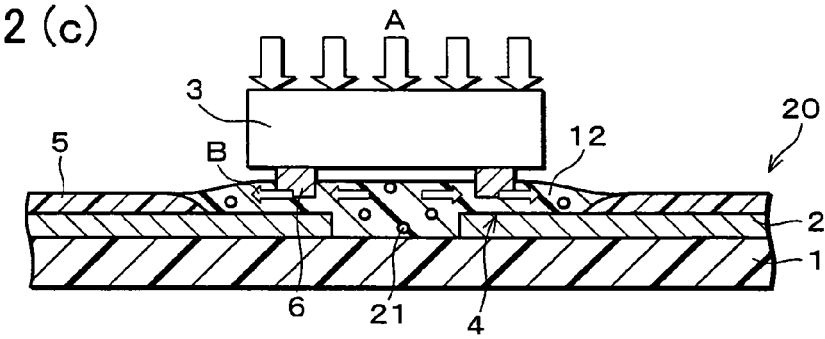
Figure 2:
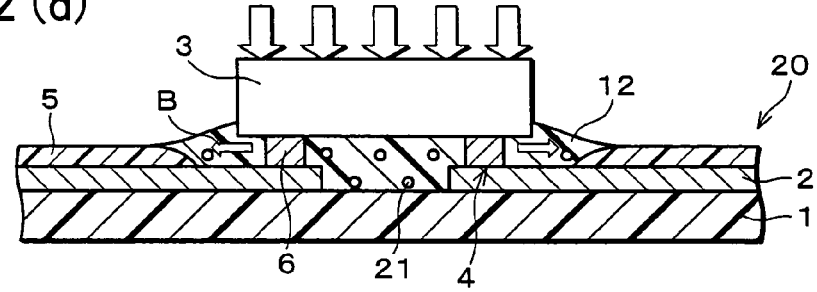
Figure 2:
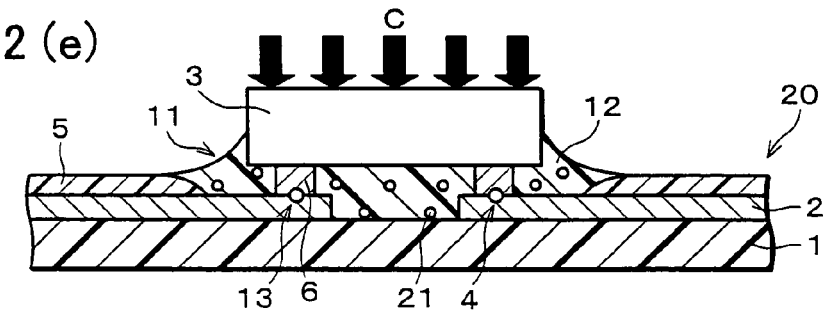

In the First Embodiment, the resin fillet 11 is produced from the insulating resin 7 containing a resin anti-repellent. In the Second Embodiment, however, the resin fillet 11 is produced from an insulating resin 12 containing conductive particles 21 dispersed in the insulating resin 12, in addition to a resin anti-repellent, as shown in FIG. 2(e).

By the conductive particles 21 dispersed in the insulating resin 12 forming the resin fillet 11, the projecting electrodes 6 of the semiconductor element 3 and the contacts 4 of the interconnection pattern 2 on the insulating tape 1 can be connected to each other via the conductive particles 21. This improves the electrical connections between the semiconductor element 3 and the interconnection pattern 2.

The conductive particles 21 used in the present embodiment are not particularly limited. Specifically, Au-coated resin particles or Ni-coated resin particles can be suitably used, for example.

The method of dispersing the conductive particles 21 in the insulating resin containing a resin anti-repellent is not particularly limited. For example, any conventionally known method can be used to disperse the conductive particles 21 in the insulating resin containing a resin anti-repellent, before the resin is cured. Further, the dispersed state of the conductive particles 21 in the insulating resin containing a resin anti-repellent is not limited to a particular state. For example, the conductive particles 21 may be used in a suitable amount according to the type or particle size of the conductive particles 21, and may be added to the insulating resin containing a predetermined amount of resin anti-repellent and sufficiently mixed therein.

The following describes the fabrication process of the semiconductor device of the present embodiment. As shown in FIG. 2(a) through Fig. (e), the fabrication process of the present embodiment, as in the First Embodiment, includes the solder resist coating step, the insulating resin applying step, the semiconductor element pressing step, and the resin curing step. The operations in each step are also the same as in the First Embodiment. The fabrication process of the present embodiment differs from that of the First Embodiment in that the semiconductor device is fabricated using the insulating resin 12 containing the conductive particles 21 dispersed in the insulating resin 12, in addition to the resin-anti-repellent, as shown in FIG. 2(b) through FIG. 2(e). With the use of the insulating resin 12, a semiconductor device is fabricated in which electrical connections between the semiconductor element 3 and the interconnection pattern 2 are made via the conductive particles 21, as shown in FIG. 2(e), at points of contact indicated by reference numeral 13.

As described, the semiconductor device and the fabrication process thereof according to the present embodiment use the insulating resin containing at least a resin anti-repellent. For improved reliability of the bonding between the semiconductor element 3 and the interconnection pattern 2, the insulating resin may contain an additional material such as the conductive particles 21.

The semiconductor device of the present invention according to the foregoing configuration, as described in the First and Second Embodiments, may be adapted so that the insulating substrate is an insulating tape that is bendable.

The COF semiconductor device using a conventional MBB technique has the problem of poor strength and poor reliability of resin sealing, and is associated with serious fabrication problems. These problems are successfully overcome by the foregoing configuration of the present invention. As a result, a high performance and high quality semiconductor device is realized.

Further, the semiconductor device of the present invention according to the foregoing configuration may be adapted so that the resin anti-repellent is a surfactant.

With this configuration, by using a surfactant as the resin anti-repellent, the problem of resin repelling in the insulating resin can be prevented. As a result, the strength and reliability of resin sealing can be improved, in addition to effectively avoiding fabrication problems.

Further, the semiconductor device of the present invention according to the foregoing configuration may be adapted so that the insulating resin is a light curable resin or a thermosetting resin.

With this configuration, the insulating resin can easily be cured by irradiation of light or application of heat, making it possible to improve strength and reliability of resin sealing with a simple fabrication step.

Further, the semiconductor device of the present invention according to the foregoing configuration may be adapted so that the insulating resin contains conductive particles dispersed in the insulating resin.

With this configuration, the conductive particles dispersed in the insulating resin enables the semiconductor element to be connected, via the conductive particles, to the interconnection pattern on the insulating substrate. This ensures the electrical connections between the semiconductor element and the interconnection pattern.

Further, the fabrication process of a semiconductor device according to the present invention may be adapted so that the insulating substrate used is an insulating tape that is bendable.

The COF semiconductor device using a conventional MBB technique has the problem of poor strength and poor reliability of resin sealing, and is associated with serious fabrication problems. These problems are successfully overcome by the foregoing configuration of the present invention. As a result, a high performance and high quality semiconductor device is realized.

Further, the fabrication process of a semiconductor device according to the present invention may be adapted so that, in the step of applying an insulating resin, the insulating resin containing the resin anti-repellent is applied in such a manner that the insulating resin is in contact with the solder resist surrounding the insulating resin, or that the insulating resin partially covers the solder resist, or the insulating resin is applied in the vicinity of the solder resist to cover the solder resist by bleeding.

With this fabrication process, the insulating resin is applied so that the insulating resin is in contact with the solder resist, or partially covers the solder resist, or the solder resist applied in the vicinity of the solder resist covers the solder resist by bleeding. This ensures that a portion of the interconnection pattern around the semiconductor element is prevented from being exposed in an area surrounded by the solder resist. Further, in providing a semiconductor device, it is ensured that a resin fillet is formed in the semiconductor element pressing step.

Further, the fabrication process of a semiconductor device according to the present invention may be adapted so that the resin anti-repellent used is a surfactant.

With this fabrication process, by using a surfactant as the resin anti-repellent, the problem of resin repelling in the insulating resin can be prevented. As a result, the strength and reliability of resin sealing can be improved, in addition to effectively avoiding fabrication problems.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
an insulating substrate having an interconnection pattern;
a solder resist;
a semiconductor element, having a projecting electrode, electrically connected to the interconnection pattern via the projecting electrode;
a resin provided between the semiconductor element and the substrate, said resin being an insulating resin containing at least a resin anti-repellent for adjusting wettability of the insulating resin,
wherein said solder resist is provided over part of the interconnection pattern but leaves the interconnection pattern exposed in an area that is to be connected to the semiconductor element via the projecting electrode, and wherein the insulating resin containing the anti-repellant covers at least edge portions of the solder resist, and wherein the solder resist is laterally offset and spaced laterally outwardly from an outer edge of the semiconductor element when viewed from above;
wherein the resin is configured so that pressing of the semiconductor element against the interconnection pattern through the resin after the resin has been provided on the substrate forms a resin fillet, the resin fillet extending no more than about half-way up a sidewall of the semiconductor element and the resin fillet sealing the projecting electrode in electrical contact with the interconnection pattern;
wherein the projecting electrode is composed of metal and does not contain solder; and
wherein the insulating substrate is a polyimide-based insulating tape that is freely bendable and that has a thickness within a range of 15 to 40 μm.

2. The semiconductor device as set forth in claim 1, wherein the resin anti-repellent improves wettability of the insulating resin for the interconnection pattern and the insulating substrate.

3. The semiconductor device as set forth in claim 1, wherein the resin anti-repellent is a surfactant.

4. The semiconductor device as set forth in claim 1, wherein the insulating resin is a light curable resin or a thermosetting resin.

5. The semiconductor device as set forth in claim 1, wherein the insulating resin contains conductive particles dispersed in the insulating resin.

6. A semiconductor device comprising:
an insulating substrate having an interconnection pattern;
a solder resist;
a semiconductor element, having a projecting electrode, electrically connected to the interconnection pattern via the projecting electrode;
a resin provided between the semiconductor element and the insulating substrate, said resin being an insulating resin, and a resin anti-repellent for improving wettability of the insulating resin for the interconnection pattern and the insulating substrate,
wherein said solder resist is provided over part of the interconnection pattern but leaves the interconnection pattern exposed in an area that is to be connected to the semiconductor element via the projecting electrode, and wherein the insulating resin containing the anti-repellant covers at least edge portions of the solder resist, and wherein the solder resist is laterally offset and spaced laterally outwardly from an outer edge of the semiconductor element when viewed from above;
wherein the resin is configured so that pressing of the semiconductor element against the interconnection pattern through the resin after the resin has been provided on the substrate forms a resin fillet, the resin fillet extending no more than about half-way up a sidewall of the semiconductor element and the resin fillet sealing the projecting electrode in electrical contact with the interconnection pattern;

wherein the projecting electrode is composed of metal and does not contain solder; and wherein the insulating substrate is a polyimide-based insulating tape that is freely bendable and that has a thickness within a range of 15 to 40 μm.

7. A semiconductor device comprising:

an insulating substrate having an interconnection pattern;

a solder resist;

a semiconductor element, having a projecting electrode, electrically connected to the interconnection pattern via the projecting electrode;

a resin provided between the semiconductor element and the substrate, said resin being an insulating resin containing at least a resin anti-repellent for adjusting wettability of the insulating resin, said solder resist coating the interconnection pattern except for an area that is connected to the semiconductor element via the projecting electrode, wherein the solder resist is laterally offset and spaced laterally outwardly from an outer edge of the semiconductor element when viewed from above;

wherein the resin is configured so that pressing of the semiconductor element against the interconnection pattern through the resin after the resin has been provided on the substrate forms a resin fillet, the resin fillet extending no more than about half-way up a sidewall of the semiconductor element and the resin fillet sealing the projecting electrode in electrical contact with the interconnection pattern; said resin fillet covering edge portions of the solder resist so that the interconnection pattern is not made exposed in an area that is not covered with the solder resist, wherein the projecting electrode is composed of metal and does not contain solder; and wherein the insulating substrate is a polyimide-based insulating tape that is freely bendable and that has a thickness within a range of 15 to 40 μm.

8. A semiconductor device comprising:

an insulating substrate having an interconnection pattern;

a solder resist;

a semiconductor element, having a projecting electrode, electrically connected to the interconnection pattern via the projecting electrode;

a resin provided between the semiconductor element and the insulating substrate, said resin being an insulating resin, and a resin anti-repellent for improving wettability of the insulating resin for the interconnection pattern and the insulating substrate, said solder resist coating the interconnection pattern except for an area that is connected to the semiconductor element via the projecting electrode, the insulating resin containing the resin anti-repellant covering edge portions of the solder resist so that the interconnection pattern is not made exposed in an area that is not covered with the solder resist, wherein the solder resist is laterally offset and spaced laterally outwardly from an outer edge of the semiconductor element when viewed from above;

wherein the resin is configured so that pressing of the semiconductor element against the interconnection pattern through the resin after the resin has been provided on the substrate so as forms a resin fillet, the resin fillet extending no more than about half-way up a sidewall of the semiconductor element and the resin fillet sealing the projecting electrode in electrical contact with the interconnection pattern;

wherein the projecting electrode is composed of metal and does not contain solder; and wherein the insulating substrate is a polyimide-based insulating tape that is freely bendable and that has a thickness within a range of 15 to 40 μm.

* * * * *